United States Patent
Ito et al.

(10) Patent No.: US 9,404,679 B2
(45) Date of Patent: Aug. 2, 2016

(54) COOLING SYSTEM AND COOLING METHOD

(71) Applicant: Hitachi, Ltd., Tokyo (JP)

(72) Inventors: Junichi Ito, Nagareyama (JP); Yasuhiro Kashirajima, Tokyo (JP); Yasuhiko Inadomi, Saitama (JP); Koichi Fukuchi, Isehara (JP)

(73) Assignee: Hitachi, Ltd., Tokyo (JP)

( * ) Notice: Subject to any disclaimer, the term of this patent is extended or adjusted under 35 U.S.C. 154(b) by 477 days.

(21) Appl. No.: 13/930,006

(22) Filed: Jun. 28, 2013

(65) Prior Publication Data

US 2014/0000300 A1 Jan. 2, 2014

(30) Foreign Application Priority Data

Jun. 28, 2012 (JP) ................. 2012-145922

(51) Int. Cl.
*F25B 39/02* (2006.01)
*F25B 25/00* (2006.01)
(Continued)

(52) U.S. Cl.
CPC ............... *F25B 39/02* (2013.01); *F24F 11/008* (2013.01); *F25B 25/005* (2013.01);
(Continued)

(58) Field of Classification Search
CPC ...... F25B 39/02; F25B 25/005; F25B 23/006; F25B 2500/01; F25B 2700/02; H05K 7/20836; H05K 7/2079; F24F 11/008; F24F 2005/0025; F24F 2011/0045
USPC ........................................ 62/119, 186, 259.2
See application file for complete search history.

(56) References Cited

U.S. PATENT DOCUMENTS 4,926,649 A * 5/1990 Martinez, Jr. ............. F24F 3/06 236/91 F
5,946,926 A * 9/1999 Hartman ................. F25D 17/02 236/25 A (Continued)

FOREIGN PATENT DOCUMENTS

EP 2 091 314 8/2009
GB 2480152 11/2011

(Continued)

OTHER PUBLICATIONS

Search Report for the UK Patent Application No. GB 1311347.7, issued on Dec. 10, 2013.

(Continued)

*Primary Examiner* — Mohammad M Ali
(74) *Attorney, Agent, or Firm* — Jones Robb, PLLC

(57) ABSTRACT

A cooling system includes; an evaporator evaporating a refrigerant by heat exchange with room air; a water-cooled condenser being arranged above the evaporator and condensing the refrigerant by heat exchange with cold water; a cold-water flow control valve controlling the flow rate of the cold water supplied to the water-cooled condenser; a refrigerant cooling tower being arranged above the evaporator and condensing the refrigerant by heat exchange with outside air; a blower being arranged at the refrigerant cooling tower and blowing the outside air; a refrigerant-temperature detector detecting the temperature of the refrigerant condensed by the water-cooled condenser and/or the refrigerant cooling tower; and a controller changing at least one of the opening in the cold-water flow control valve and the rotational speed of a motor in the blower according to the temperature.

4 Claims, 4 Drawing Sheets

(51) Int. Cl.
*F24F 11/00* (2006.01)
*H05K 7/20* (2006.01)
*F25B 23/00* (2006.01)
*F24F 5/00* (2006.01)

(52) U.S. Cl.
CPC ......... *H05K 7/2079* (2013.01); *H05K 7/20836* (2013.01); *F24F 2005/0025* (2013.01); *F24F 2011/0045* (2013.01); *F25B 23/006* (2013.01); *F25B 2500/01* (2013.01); *F25B 2700/02* (2013.01); *F25B 2700/2106* (2013.01)

(56) References Cited

U.S. PATENT DOCUMENTS

| | | | | |
|---|---|---|---|---|
| 6,185,946 | B1* | 2/2001 | Hartman | F04D 15/029 236/1 EA |
| 7,124,597 | B2* | 10/2006 | Kattner | F25B 25/005 62/260 |
| 7,855,890 | B2* | 12/2010 | Kashirajima | F25B 25/00 361/679.46 |
| 2003/0182949 | A1* | 10/2003 | Carr | C09K 5/10 62/99 |
| 2006/0168979 | A1* | 8/2006 | Kattner | F25B 25/005 62/260 |
| 2009/0201645 | A1* | 8/2009 | Kashirajima | F25B 25/00 361/700 |
| 2010/0010681 | A1* | 1/2010 | Zugibe | F25B 49/02 700/282 |
| 2011/0041528 | A1* | 2/2011 | Charbel | F25B 39/028 62/115 |
| 2011/0056223 | A1* | 3/2011 | Kashirajima | F25B 25/00 62/149 |
| 2011/0185758 | A1 | 8/2011 | Shimokawa et al. | |
| 2011/0271695 | A1* | 11/2011 | Kashirajima | G06F 1/206 62/62 |
| 2011/0314853 | A1* | 12/2011 | Ito | H05K 7/20836 62/186 |

FOREIGN PATENT DOCUMENTS

| | | |
|---|---|---|
| GB | 2481317 | 12/2011 |
| JP | 08114347 A | 5/1996 |
| JP | 2001304652 A | 10/2001 |
| JP | 2004-232927 | 8/2004 |
| JP | 2006-507676 | 3/2006 |
| JP | 2007-127315 | 5/2007 |
| JP | 2009216295 A | 9/2009 |
| JP | 2010232689 A | 10/2010 |
| JP | 2011237887 A | 11/2011 |
| WO | WO 2004/049774 A1 | 6/2004 |

OTHER PUBLICATIONS

Notice of Reasons for Rejection in JP Patent Application No. 2012-145922, dated Aug. 18, 2015.

* cited by examiner

COOLING SYSTEM AND COOLING METHOD

CROSS-REFERENCE TO RELATED APPLICATIONS

This application claims the foreign priority benefit under 35 U.S.C. §119 of Japanese Patent Application No. 2012-145922, filed on Jun. 28, 2012, the disclosure of which is incorporated herein by reference.

BACKGROUND OF THE INVENTION

1. Field of the Invention

The present invention relates to a cooling system and a cooling method.

2. Description of the Related Art

Recently, with the improvement in the information processing technology and the development of the Internet environment, required amounts of information processing have been increasing, and the business of the data processing center for massive processing of various types of information has been in the spotlight. For example, in the sever room in the data processing center, a great number of electronic devices are arranged in a centralized manner, and are continuously operating day and night.

By the way, the rack mounted system is currently the mainstream of the system for placing electronic devices in the sever room. In the rack mounted system, electronic devices are classified on the basis of their functions, housed in chassis or racks on a function-by-function basis, and stacked in racks or cabinets. On the floor of the sever room, a number of racks or cabinets in which electronic devices are mounted as above are disposed.

Incidentally, when electronic devices are placed in a high-temperature environment, the possibility of occurrence of a trouble such as a system stop increases. Therefore, it is necessary to suppress the environmental temperature below a predetermined value. However, since the processing capacities of the electronic devices have been rapidly improving, the amounts of heat emitted from the electronic devices keep on increasing.

Actually, the air-conditioning power needed for cooling the sever room is greatly increasing, and reduction of the air-conditioning power is urgently necessary from the viewpoint of conservation of global environment as well as the viewpoint of cost reduction in business management.

For example, Japanese Patent Laid-open No. 2006-507676 (which is hereinafter referred to as Patent Literature 1) discloses a cooling system in which a rear cover, a front cover, and a cooling-air subframe are arranged around an electronic device. In addition, Patent Literature 1 discloses that a fan and a heat exchanger are arranged in the cooling-air subframe, and cooling air is caused to flow in a closed loop through the electronic device.

Japanese Patent Laid-open No. 2004-232927 (which is hereinafter referred to as Patent Literature 2) discloses that an electronic device is cooled by absorbing heat with an evaporator which is mounted inside a rack provided for housing the electronic device, and heat is discharged rearward or upward from a water-cooled condenser, which is mounted on the back side of the rack provided for housing the electronic device.

Japanese Patent Laid-open No. 2007-127315 (which is hereinafter referred to as Patent Literature 3) discloses a cooling system which performs cooling by causing natural circulation of a refrigerant between a water-cooled condenser and a heat exchanger for cooling, and using the latent heat of evaporation of the refrigerant which flows through the heat exchanger for cooling.

According to the techniques disclosed in Patent Literatures 1 and 2, although the cooling can be assisted by arranging a cooling system around the electronic device, the cooling system consumes air-conditioning power. Therefore, there is room for improvement in the above techniques from the viewpoint of energy saving.

In addition, according to the technique disclosed in Patent Literature 3, although the refrigerant is naturally circulated, only the low-temperature liquid from an ice storage can supply cold to the refrigerant gas flowing through the water-cooled condenser. Therefore, there is room for improvement in energy saving performance.

SUMMARY OF THE INVENTION

In order to solve the above problem, the object of the present invention is to provide a cooling system and a cooling method which realize efficient air conditioning.

In order to achieve the above object, the cooling system and the cooling method according to the present invention are characterized in that a control means changes at least one of the opening of a flow control valve for cold water and the rotational speed of a motor in a blower, according to the temperature of a refrigerant which is detected by a refrigerant-temperature detection means.

According to the present invention, air conditioning can be efficiently performed.

DETAILED DESCRIPTION OF THE INVENTION

Hereinbelow, the cooling systems as preferable embodiments of the present invention are explained with reference to the accompanying drawings. In addition, in the following explanations, identical or equivalent components or constituents may be indicated by the same reference numbers through all the embodiments. In addition, identical explanations are not repeated through the embodiments.

1. First Embodiment

1.1 Configuration of Cooling System

Figure 1:
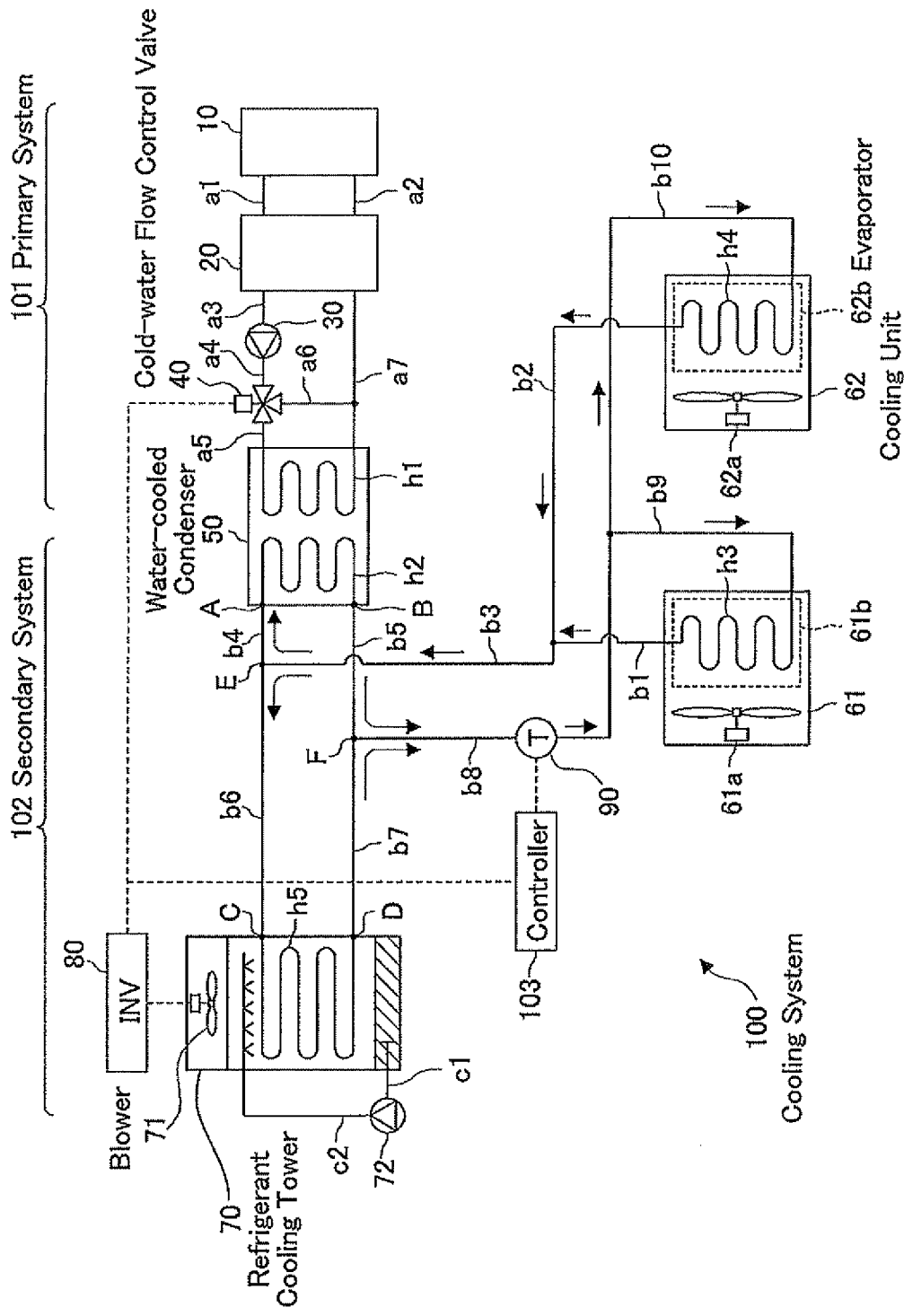
FIG. 1 is a diagram illustrating a cooling system according to a first embodiment of the present invention.

FIG. 1 is a diagram illustrating configuration of a cooling system for controlling the cold generation apparatus according to the first embodiment. As illustrated in FIG. 1, the cooling system 100 includes a primary system 101, a secondary system 102, and a controller 103.

1.2 Primary System

The primary system 101 includes heat-source equipment 10, a cool reservoir 20, a cold-water pump 30, a cold-water flow control valve 40, and a primary heat-transfer tube h1 in a water-cooled condenser 50.

The heat-source equipment 10 is, for example, a turbo refrigerator, and supplies cold to the cool reservoir 20. In the heat-source equipment 10, a compressor (not shown), a condenser (not shown), an expansion valve (not shown), and an evaporator (not shown) are connected in this order through piping arrangements, and a refrigerant is circulated in a known refrigeration cycle. In addition, the water flowing from the cool reservoir 20 through a piping arrangement a1 is cooled by heat exchange with the refrigerant flowing through the above evaporator, and is then returned to the cool reservoir 20 through a piping arrangement a2, so that the cold water reserved in the cool reservoir 20 is maintained at a predetermined temperature.

The heat-source equipment 10 is not limited to the turbo refrigerator using the refrigeration cycle. For example, the absorption-type heat source equipment using a liquid or solid absorbent or the thermoelectric heat source equipment may be used. Further, it is preferable to operate the heat-source equipment 10 by using commercial electric power in the nighttime, during which the commercial electric power is relatively inexpensive.

The cool reservoir 20 holds a predetermined amount of cold water. The cool reservoir 20 is connected to the intake side of the cold-water pump 30 through a piping arrangement a3, and to the primary heat-transfer tube h1 in the water-cooled condenser 50 through a piping arrangement a7.

The cold-water pump 30 is a pump which pumps cold water from the cool reservoir 20 toward the primary heat-transfer tube h1 in the water-cooled condenser 50 at a predetermined flow rate. That is, when the cold-water pump 30 is driven, the cold water is drawn in from the cool reservoir 20 through the piping arrangement a3, and is then supplied to the primary heat-transfer tube h1 in the water-cooled condenser 50 through the piping arrangement a4, the cold-water flow control valve 40, and a piping arrangement a5. At this time, part of the cold water splits into a piping arrangement a6 at a flow rate corresponding to the opening in the cold-water flow control valve 40.

The cold-water flow control valve 40 is a three-way valve for controlling the flow rate of the cold water supplied to the water-cooled condenser 50. The cold-water flow control valve 40 is connected to the discharge side of the cold-water pump 30 through the piping arrangement a4, to the primary heat-transfer tube h1 in the water-cooled condenser 50 through the piping arrangement a5, and to the cool reservoir 20 and the primary heat-transfer tube h1 through the piping arrangements a6 and a7. The piping arrangement a6 is connected at one end to the cold-water flow control valve 40 and at the other end to the piping arrangement a7 in such an arrangement that the piping arrangement a6 straddles the water-cooled condenser 50.

The opening of the cold-water flow control valve 40 is controlled in accordance with a command signal from the controller 103, and the cold-water flow control valve 40 spits the cold water flowing into the piping arrangement a4, into the piping arrangements a5 and a6 in a split ratio corresponding the opening of the cold-water flow control valve 40. That is, the cold water is supplied to the primary heat-transfer tube h1 in the water-cooled condenser 50 through the piping arrangement a5 at the flow rate corresponding to the opening of the cold-water flow control valve 40.

The water-cooled condenser 50 cools the refrigerant flowing from evaporators 61b and 62b in cooling units 61 and 62 into a secondary heat-transfer tube h2, with the cold water flowing through the primary heat-transfer tube h1, so as to condense the cold water. The water-cooled condenser 50 is connected in parallel with a refrigerant cooling tower 70, and arranged at a higher elevation than the cooling units 61 and 62.

The water-cooled condenser 50 includes the primary heat-transfer tube h1 and the secondary heat-transfer tube h2. One end (the inlet for the flow of the cold water) of the primary heat-transfer tube h1 is connected to the piping arrangement a5, and the other end (the outlet for the flow of the cold water) of the primary heat-transfer tube h1 is connected to the piping arrangement a7.

On the other hand, one end (the inlet A for the flow of the refrigerant) of the secondary heat-transfer tube h2 is connected to a piping arrangement b4, and the other end (the outlet B for the flow of the refrigerant) of the secondary heat-transfer tube h2 is connected to a piping arrangement b5. In the secondary heat-transfer tube h2, the inlet A for the flow of the refrigerant is arranged at a higher elevation than the outlet B for the flow of the refrigerant. Therefore, when the refrigerant flowing through the secondary heat-transfer tube h2 condenses into liquid, the liquid refrigerant can be lead downward to the outlet B by gravity.

In addition, the primary heat-transfer tube h1 and the secondary heat-transfer tube h2 are arranged in contact with each other directly or through heat-transfer fins, so that heat can be efficiently exchanged between the cold water flowing through the primary heat-transfer tube h1 and the refrigerant flowing through the secondary heat-transfer tube h2.

The water-cooled condenser 50 is arranged at a higher elevation than the cooling units 61 and 62 (for example, on the roof of a building) in order to realize natural circulation of the refrigerant, which is explained later.

1.3 Secondary System

The secondary system 102 includes the cooling units 61 and 62, the secondary heat-transfer tube h2 in the water-cooled condenser 50, the refrigerant cooling tower 70, an inverter 80, and a liquid-refrigerant temperature sensor 90.

In addition, the secondary system 102 contains neither a compressor nor an expansion valve, and realizes a natural circulation cycle in which the refrigerant is circulated by upward movement of the refrigerant in gaseous form produced by evaporation in the evaporators 61b and 62b and downward movement, caused by gravity, of the refrigerant in liquid form produced by condensation by the water-cooled condenser 50 and the refrigerant cooling tower 70.

The cooling unit 61 cools room air by blowing cooled air into a space in which, for example, electronic devices (such as severs) are arranged (i.e., a space subject to air conditioning). The cooling unit 61 includes a fan 61a and the evaporator 61b. The cooling unit 61 is arranged at a lower elevation than the water-cooled condenser 50 and the refrigerant cooling tower 70.

As mentioned before, the temperature of the air in the space subject to air conditioning is relatively high because of heat emission from the electronic devices. The fan 61a rotates at a predetermined rotational speed, takes in the high-temperature room air, and blows out the room air toward a heat-transfer tube h3 in the evaporator 61b. One end (the inlet for the flow of the refrigerant) of the heat-transfer tube h3 is connected to a piping arrangement b9, and the other end (the outlet for the flow of the refrigerant) of the heat-transfer tube h3 is connected to a piping arrangement b1. Heat is exchanged between the refrigerant flowing through the heat-transfer tube h3 and the high-temperature air blown out from the fan 61a.

The cooling unit 62 includes a construction similar to the cooling unit 61. (Therefore, explanations on the construction of the cooling unit 62 are not presented.) The cooling unit 62 is arranged in parallel with the cooling unit 61 at a lower elevation than the water-cooled condenser 50 and the refrigerant cooling tower 70. The cooling units 61 and 62 may be arranged at an identical elevation or at different elevations (for example, at different floors).

The refrigerant gas flows from the cooling units 61 and 62 into the secondary heat-transfer tube h2 in the water-cooled condenser 50 through piping arrangements b3 and b4, so that heat is exchanged between the refrigerant gas and the cold water flowing through the primary heat-transfer tube h1. The heat exchange condenses the refrigerant gas into liquid. Then, the liquid refrigerant flows down through the piping arrangement b5 and a piping arrangement b8, and returns to the evaporators 61b and 62b.

The refrigerant cooling tower 70 includes a heat-transfer tube h5, a blower 71, and a water-sprinkler pump 72. In the refrigerant cooling tower 70, the outside air is blown onto the heat-transfer tube h5, through which the refrigerant gas flows. Therefore, heat is exchanged between the refrigerant gas and the outside air, and the refrigerant gas condenses into liquid. In order to cause natural circulation of the refrigerant between the refrigerant cooling tower 70 and the evaporators 61b and 62b, the refrigerant cooling tower 70 is arranged at a higher elevation than the cooling units 61 and 62 (for example, on the roof of the building).

Further, it is preferable to arrange the refrigerant cooling tower 70 at the same elevation as the water-cooled condenser 50. In this case, the refrigerant gas flowing upward through a piping arrangement b3 can be appropriately split according to the pressure in the secondary heat-transfer tube h2 in the water-cooled condenser 50 and the pressure in the heat-transfer tube h5 in the refrigerant cooling tower 70. (Details are explained later.)

Inside the refrigerant cooling tower 70, the heat-transfer tube h5 is arranged, and the blower 71 is arranged at a higher elevation than the heat-transfer tube h5. One end (the inlet C for the flow of the refrigerant) of the heat-transfer tube h3 is connected to a piping arrangement b6, and the other end (the outlet D for the flow of the refrigerant) of the heat-transfer tube h3 is connected to a piping arrangement b7. The inlet C of the heat-transfer tube h5 is arranged at a higher elevation than the outlet D of the heat-transfer tube h5. Therefore, when the refrigerant gas flowing through the heat-transfer tube h5 condenses into liquid, the liquid refrigerant can be lead downward to the outlet D by gravity.

The blower 71 is arranged above or beside the heat-transfer tube h5. The blower 71 is rotated by a motor (not shown), and blows the outside air toward the heat-transfer tube h5, through which the refrigerant flows. The above motor is driven by the inverter 80.

The water-sprinkler pump 72 is a pump which draws in, through a piping arrangement c1, the water temporarily held at the bottom of the refrigerant cooling tower 70, and pumps out (upward) the water through a piping arrangement c2. Holes (not shown) are formed on the underside of a downstream portion of the piping arrangement c2, and the downstream portion of the piping arrangement c2 is arranged between the blower 71 and the heat-transfer tube h5 in such a manner that the pumped-up water is sprinkled from the holes toward the heat-transfer tube h5.

That is, in the refrigerant cooling tower 70, heat is exchanged between the outside air blown into the refrigerant cooling tower 70 by the blower 71 and the refrigerant flowing through the heat-transfer tube h5, and the heat exchange is promoted by the sprinkling, over the heat-transfer tube h5, of the water pumped up by the water-sprinkler pump 72. The water-sprinkler pump 72 is driven and stopped together with the blower 71.

The inverter 80 supplies, to the motor (not shown) arranged in the blower 71, AC (Alternating Current) power at a predetermined frequency according to a command signal inputted from the controller 103. Although not shown, AC power from a commercial power supply is temporarily converted into a DC (Direct Current) power and the DC power is supplied to the inverter 80. The inverter 80 converts the DC power into the AC power at the predetermined frequency according to the command signal from the controller 103, and outputs the AC power to the motor in the blower 71. Thus, the blower 71 rotates at a rotational speed corresponding to the command signal, and blows the outside air toward the heat-transfer tube h5.

The liquid-refrigerant temperature sensor 90 (as a means for detecting the temperature of the refrigerant) is a sensor for detecting the temperature of the liquid refrigerant which is produced by condensation in the water-cooled condenser 50 and/or the refrigerant cooling tower 70 and returned to the evaporators 61b and 62b through a piping arrangement b8. The liquid-refrigerant temperature sensor 90 outputs the detected temperature of the liquid refrigerant to the controller 103 from time to time.

1.4 Controller

The controller 103 (as a control means) includes a CPU (Central Processing Unit), a RAM (Random Access Memory), a ROM (Read-only Memory), and electronic circuits including various interfaces.

The controller 103 changes at least one of the opening of the cold-water flow control valve 40 and the rotational speed of the motor in the blower 71 according to the temperature of the liquid refrigerant detected by the liquid-refrigerant temperature sensor 90. Therefore, the cooling units 61 and 62 blow out air at the predetermined temperature corresponding to an air-conditioning temperature, which is preset.

Details of the operations performed by the controller 103 are explained later.

1.5 Circulation of Refrigerant

The circulation of the refrigerant which is caused in the case where cold water is supplied to the water-cooled condenser 50 through the cold-water flow control valve 40 at a predetermined flow rate and the blower 71 is driven to blow air at a predetermined flow rate is explained below. In the following explanations, it is assumed that a motor (not shown) in the cold-water pump 30, a motor (not shown) in the water sprinkler pump 72, and motors (not shown) in the fans 61a and 62a each rotate at a predetermined (fixed) rotational speed.

When the fan 61a blows high-temperature air in the room (the space subject to air conditioning) into the cooling unit 61, the liquid refrigerant flowing through the heat-transfer tube h3 in the evaporator 61b evaporates into refrigerant gas by heat exchange with (heat absorption from) the high-temperature air. At this time, the high-temperature air blown by the fan 61a is cooled by heat transfer to the refrigerant, so that cool air at a predetermined temperature is blown out from the cooling unit 61.

On the other hand, the density of the refrigerant gas flowing out of the heat-transfer tube h3 is low, the refrigerant gas flowing out of the heat-transfer tube h3 flows upward through the piping arrangement b1. Similar operations occur in the cooling unit 62, the refrigerant gas flowing out of a heat-transfer tube h4 flows upward through a piping arrangement b2.

The refrigerant gas flowing through the piping arrangement b1 and the refrigerant gas flowing through the piping arrangement b2 join together, flow upward through the piping arrangement b3, and split at the connection point E. The split ratio between the refrigerant gas flowing toward the water-cooled condenser 50 through the piping arrangement b4 and the refrigerant gas flowing toward the refrigerant cooling tower 70 through the piping arrangement b6 corresponds to the ratio between the amount of the refrigerant condensing in the water-cooled condenser 50 and the amount of the refrigerant condensing in the refrigerant cooling tower 70.

For example, in the case where the amount of the refrigerant condensing in the refrigerant cooling tower 70 is greater than the amount of the refrigerant condensing in the water-cooled condenser 50, the pressure in the heat-transfer tube h5 in the refrigerant cooling tower 70 is lower than the pressure in the secondary heat-transfer tube h2 in the water-cooled condenser 50. Therefore, the flow rate of the refrigerant gas flowing toward the refrigerant cooling tower 70 through the piping arrangement b6 becomes greater than the flow rate of the refrigerant gas flowing toward the water-cooled condenser 50 through the piping arrangement b4.

Thus, the flow rate of the refrigerant gas flowing into one of the water-cooled condenser 50 and the refrigerant cooling tower 70 which exhibits higher refrigeration performance is higher. The refrigeration performance of the water-cooled condenser 50 varies with the opening of the cold-water flow control valve 40, and the refrigeration performance of the refrigerant cooling tower 70 varies with the rotational speed of the blower 71.

The flow of the refrigerant gas which branches off at the connection point E and flows into the secondary heat-transfer tube h2 through the piping arrangement b4 undergoes heat exchange with (transfers heat to) the cold water flowing through the primary heat-transfer tube h1, so that the refrigerant gas condenses into liquid. Since the density of the liquid refrigerant is high, the liquid refrigerant flows downward through the secondary heat-transfer tube h2 by gravity, and further flows through the piping arrangement b5 to the connection point F.

On the other hand, the flow of the refrigerant gas which branches off at the connection point E and flows into the heat-transfer tube h5 through the piping arrangement b6 undergoes heat exchange with (transfers heat to) the outside air blown by the blower 71 and the water sprinkled from the downstream portion of the piping arrangement c2, so that the refrigerant gas condenses into liquid. The liquid refrigerant flows downward through the heat-transfer tube h5 by gravity, and further flows through the piping arrangement b7 to the connection point F.

Then, the liquid refrigerant flowing through the piping arrangement b5 and the liquid refrigerant flowing through the piping arrangement b7 join together at the connection point F, and flow downward through the piping arrangement b8 by gravity. Then, a part of the joined liquid refrigerant further flows downward through the piping arrangement b9 by gravity into the heat-transfer tube h3 in the cooling unit 61. In addition, the other part of the joined liquid refrigerant further flows downward through the piping arrangement b10 by gravity into the heat-transfer tube h4 in the cooling unit 62.

As described above, the refrigerant in the secondary system 102 naturally circulates between the cooling units 61 and 62 and the water-cooled condenser 50 or the refrigerant cooling tower 70 while being subject to the repeated phase transitions.

1.6 Operations of Cooling System

Hereinbelow, the operations performed by the controller 103 for controlling the opening of the cold-water flow control valve 40 and driving of the blower 71 is explained. In the following explanations, it is assumed that the air-conditioning temperature is preset to a fixed value.

Figure 2A:
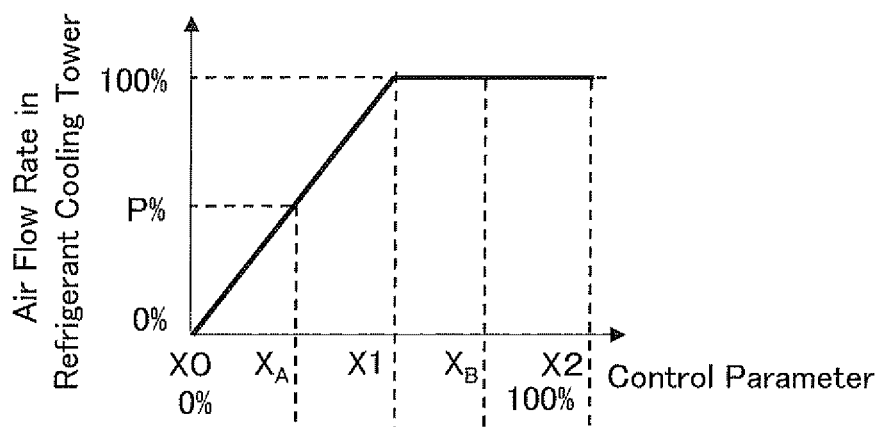
FIG. 2A is a graph indicating a relationship between a control parameter and the air flow rate in a refrigerant cooling tower.
Figure 2B:
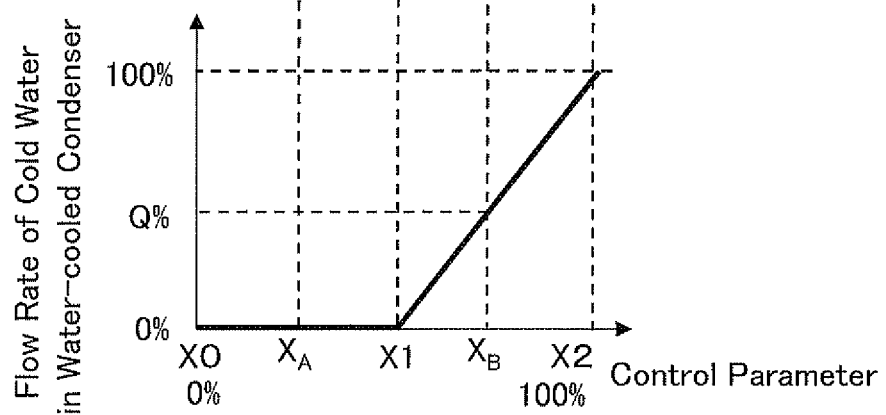
FIG. 2B is a graph indicating a relationship between the control parameter and the flow rate of cold water supplied to a water-cooled condenser.

FIG. 2A is a graph indicating a relationship between a control parameter and the air flow rate in the refrigerant cooling tower, and FIG. 2B is a graph indicating a relationship between the control parameter and the flow rate of the cold water supplied to the water-cooled condenser.

The control parameter, which is indicated by the abscissas in the graphs (a) and (b), is a value which is outputted from the controller 103 to the inverter 80, and corresponds to the cooling performance of the cooling system 100, which depends on the opening of the cold-water flow control valve 40 and the rotational speed of the blower 71. For example, when the controller 103 performs PID (Proportional Integral Derivative) control, the controller 103 calculates the control parameter such that the temperature of the liquid refrigerant detected by the liquid-refrigerant temperature sensor 90 approaches the target refrigerant temperature corresponding to the air-conditioning temperature which is preset. Further, the controller 103 sets the control parameter such as to increase with the air-conditioning load which the cooling system 100 is required to take.

For example, in the case where the temperature of the liquid refrigerant detected by the liquid-refrigerant temperature sensor 90 is considerably higher than the target refrigerant temperature, the control parameter is set to a large value for the proportional (P) control. Further, the value of the control parameter is set in consideration of the history of the temperature of the liquid refrigerant, as well as the current temperature of the liquid refrigerant detected by the liquid-refrigerant temperature sensor 90, for the integral (I) control and the derivative (D) control.

In FIGS. 2A and 2B, the indications "0%" and "100%" under the abscissas "X0" and "X2" show that the relative value of the air-conditioning performance of the cooling system 100 corresponding to the control parameter with respect to the maximum air-conditioning capacity of the cooling system 100 which the cooling system 100 can achieve is 0% when the control parameter is equal to X0, and 100% when the control parameter is equal to X2. In addition, the value "Air Flow Rate in Refrigerant Cooling Tower" indicated by the ordinate in the graph in FIG. 2A is the relative value of the actual air flow rate in the refrigerant cooling tower 70 with respect to the air flow rate when the blower 71 is driven at the rated rotational speed, and the value "Flow Rate of Cold Water in Water-cooled Condenser" indicated by the ordinate in the graph in FIG. 2B is the relative value of the actual flow rate of the cold water in the water-cooled condenser 50 with respect to the flow rate of the cold water when all the cold water flowing through the piping arrangement a4 flows into the water-cooled condenser 50.

In the following explanations, the temperature of the liquid refrigerant detected by the liquid-refrigerant temperature sensor 90 is simply referred to as the liquid-refrigerant temperature. In addition, stopping the supply of the cold water to the water-cooled condenser 50 by control of the cold-water flow control valve 40 may be simply expressed as closing the valve. Further, increasing the flow rate of the cold water into the water-cooled condenser 50 may be expressed as widening the opening of the cold-water flow control valve 40.

The value X0 of the control parameter, which is indicated on the abscissas in the graphs (a) and (b), is the value which is outputted from the controller 103 to the inverter 80 when the liquid-refrigerant temperature is approximately equal to the predetermined target refrigerant temperature and therefore further cooling is unnecessary. In other words, when no air-conditioning load is imposed on the cooling system 100, the value X0 of the control parameter is outputted from the controller 103. The target refrigerant temperature is a (fixed) value determined according to the air-conditioning temperature which is preset, and is stored in a storage means (not shown). When the value X0 of the control parameter is outputted from the controller 103, the controller 103 does not drive the blower 71 (as indicated in the graph in FIG. 2A), and closes the cold-water flow control valve 40 (as indicated in the graph in FIG. 2B).

The value of the control parameter outputted from the controller 103 is continuously increased with increase in the excess of the liquid-refrigerant temperature over the target refrigerant temperature, so that the rotational speed of the blower 71 is increased with increase in the excess of the liquid-refrigerant temperature over the target refrigerant temperature. For example, when the value of the control parameter is $X_A$, the controller 103 drives the blower 71 so as to realize P % of the air flow rate which is realized when the blower 71 is driven at the rated rotational speed the power. At this time, the cold-water flow control valve 40 is still closed, so that the state in which the cold water is not supplied to the water-cooled condenser 50 is maintained as indicated in the graph in FIG. 2B.

The controller 103 keeps the cold-water flow control valve 40 closed until the control parameter reaches the predetermined value X1 and the rotational speed of the blower 71 reaches the rated rotational speed as indicated in the graph in FIG. 2A. That is, when the refrigeration capacity of the refrigerant cooling tower 70 is sufficient to achieve the refrigeration performance which the cooling system 100 is required to achieve, i.e., when the control parameter is equal to or greater than X0 and smaller than X1, cold is supplied to the refrigerant in only the refrigerant cooling tower 70 and supply of the cold water to the water-cooled condenser 50 is stopped.

When cold is supplied to the refrigerant in only the refrigerant cooling tower 70, the refrigerant gas condenses mainly in the refrigerant cooling tower 70, so that the pressure in the heat-transfer tube h5 in the refrigerant cooling tower 70 becomes lower than the pressure in the secondary heat-transfer tube h2 in the water-cooled condenser 50. Therefore, the refrigerant gas naturally flows into the refrigerant cooling tower 70.

In addition, when the excess of the liquid-refrigerant temperature over the target refrigerant temperature is a certain value, and the control parameter is a predetermined value $X_B$ greater than X1, the controller 103 performs the following operations for control. That is, while driving the blower 71 in the refrigerant cooling tower 70 at the rated rotational speed as indicated in the graph in FIG. 2A, the controller 103 widens the opening in the cold-water flow control valve 40, and supplies the cold water to the primary heat-transfer tube h1 at the flow rate corresponding to Q % of the fully open flow rate. In other words, when the control parameter is greater than the predetermined value X1, the controller 103 controls the opening of the cold-water flow control valve 40 so as to supply the cold water to the water-cooled condenser 50 while driving the blower 71.

The refrigerant gas flowing through the piping arrangement b3 to the connection point E splits into the piping arrangements b6 and b4 in a split ratio corresponding to the refrigeration performance (the amounts of condensation) of the refrigerant cooling tower 70 and the water-cooled condenser 50. Thus, the water-cooled condenser 50 makes up for the shortage of the refrigeration performance in the refrigerant cooling tower 70.

When the excess of the liquid-refrigerant temperature over the target refrigerant temperature further increases, and the control parameter is a predetermined value X2 greater than $X_B$, the controller 103 fully opens the cold-water flow control valve 40 while driving the blower 71 in the refrigerant cooling tower 70 at the rated rotational speed. At this time, the maximum refrigeration capacity is exploited from each of the refrigerant cooling tower 70 and the water-cooled condenser 50. Each of the refrigerant cooling tower 70 and the water-cooled condenser 50 is configured, on the basis of annual data of atmospheric temperature in the area in which the cooling system 100 is placed, to have such a refrigeration capacity that the range of the control parameter below X2 is sufficient for controlling the cooling system 100.

1.7 Advantages of First Embodiment

The cooling system 100 according to the first embodiment has the following advantages.

(1) The refrigerant is naturally circulated between the water-cooled condenser 50 and the evaporators 61b and 62b and/or between the refrigerant cooling tower 70 and the evaporators 61b and 62b. Therefore, no pump for pumping the refrigerant is necessary, so that the running cost can be reduced and the high-temperature waste heat generated by the electronic devices and the like can be efficiently removed.

(2) The controller 103 calculates the control parameter on the basis of the liquid-refrigerant temperature detected by the liquid-refrigerant temperature sensor 90, and controls the cooling system 100 by using the control parameter. Therefore, it is possible to prevent excessive cooling and continue energy-saved operation.

(3) When the control parameter is equal to or greater than X0 and smaller than X1, the controller 103 causes the cold-water flow control valve 40 to fully close, and drives the blower 71 at a rotational speed corresponding to the value of the control parameter. That is, when the required cooling can be achieved by using only the cold produced by the blower 71 blowing the outside air, the water-cooled condenser 50 is not used and the refrigerant cooling tower 70 is preferentially used. Therefore, the cooling system 100 according to the first embodiment can minimize the amount of the cold water used for cooling the refrigerant, and reduce the thermal driving power consumed by the heat-source equipment 10. Further, since the cold of the outside air can be effectively used, it is possible to reduce the total running cost and improve the energy-saving performance.

(4) For example, when the control parameter is smaller than X2 (corresponding to 100% of the cooling capacity of the cooling system 100 as indicated in FIGS. 2A and 2B), the controller 103 preferentially lowers the refrigeration performance of the water-cooled condenser 50 according to the control parameter. Therefore, even when the refrigeration capacity of the refrigerant cooling tower 70 is lowered, for example, in the intermediate-temperature seasons (such as spring and fall), the refrigerant cooling tower 70 is caused to operate with its maximum capacity by using the cold of the outside air, and the water-cooled condenser 50 can make up for the shortage of the refrigeration performance. Thus, it is possible to use the cold of the outside air for a long period of time, and thus reduce the total running cost of the cooling system 100.

(5) In the cooling system 100, the water-cooled condenser 50 and the refrigerant cooling tower 70 are connected in parallel. Therefore, the refrigerant gas splits into the piping arrangements b4 and b6 according to the amount of the refrigerant condensed in the water-cooled condenser 50 and the amount of the refrigerant condensed in the refrigerant cooling tower 70. In other words, the refrigerant gas naturally splits according to the refrigeration performance of the refrigerant cooling tower 70 and the refrigeration performance of the water-cooled condenser 50. Thus, it is possible to simplify the operations for controlling the entire cooling system 100.

(6) Since the water-cooled condenser 50 and the refrigerant cooling tower 70 are connected in parallel in the cooling system 100, the refrigerant gas which is split in some split ratio and flows into the refrigerant cooling tower 70 condenses by heat exchange with the outside air, When the refrigerant gas condenses, a great amount of heat is released from the refrigerant. Therefore, the cold of the outside air can be effectively used in the cooling system 100 having the above parallel connection, compared with a configuration in which the water-cooled condenser 50 and the refrigerant cooling tower 70 are connected in series.

2. Second Embodiment 2.1 Outline of Second Embodiment

The second embodiment is similar to the first embodiment except that an outside-air temperature sensor (not shown) and an outside-air humidity sensor (not shown) are arranged, and the operations of the controller 103 in the second embodiment are different from the first embodiment. Therefore, the following explanations are focused on the differences from the first embodiment, and the explanations on the portions of the second embodiment similar to the first embodiment are not presented below.

The outside-air temperature sensor (which is a means for detecting the temperature of the outside air) is placed in an arbitrary place in which the temperature of the outside air in the vicinity of the refrigerant cooling tower 70 can be detected, and outputs the detected temperature of the outside air to the controller 103 from time to time. The outside-air humidity sensor (which is a means for detecting the humidity of the outside air) is placed in an arbitrary place in which the humidity of the outside air in the vicinity of the refrigerant cooling tower 70 can be detected, and outputs the detected humidity of the outside air to the controller 103 from time to time.

Similar to the first embodiment, the water-cooled condenser 50 and the refrigerant cooling tower 70 are connected in parallel in the cooling system 100 according to the second embodiment, and arranged at higher elevations than the cooling units 61 and 62 (as illustrated in FIG. 1).

2.2 Operations of Cooling System

Figure 3:
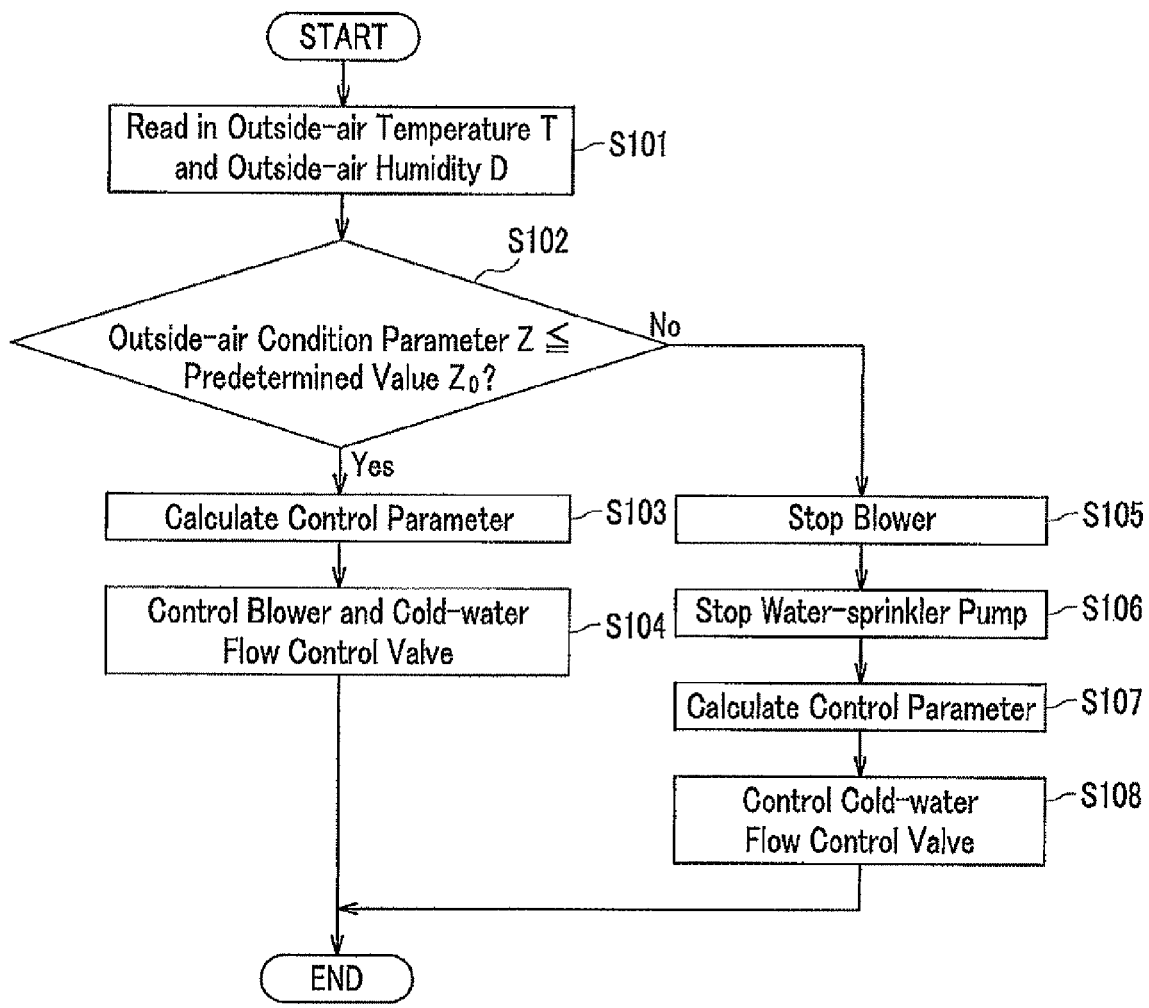
FIG. 3 is a flow diagram indicating a flow of operations of a cooling system according to a second embodiment of the present invention.

FIG. 3 is a flow diagram indicating a flow of operations of the cooling system according to the second embodiment.

In step S101, the controller 103 reads into a storage means (not shown) an outside-air temperature T inputted from the outside-air temperature sensor and an outside-air humidity D inputted from the outside-air humidity sensor.

In step S102, the controller 103 determines whether or not the value of an outside-air condition parameter Z, which is calculated on the basis of the outside-air temperature T and the outside-air humidity D (which are read into the storage means in step 101), is equal to or smaller than a predetermined value $Z_0$. The outside-air condition parameter Z increases with increase in the outside-air temperature, and also increases with increase in the outside-air humidity. The values of the outside-air condition parameter Z are stored in advance in the storage means in association with the values of the outside-air temperature T and the outside-air humidity D. The predetermined value $Z_0$ is preset and stored in the storage means. When the outside-air condition parameter Z is equal to or smaller than the predetermined value $Z_0$, i.e., when yes is determined in step S102, the operation of the controller 103 goes to step S103.

In step S103, the controller 103 calculates the control parameter in a similar manner to the first embodiment. That is, the controller 103 performs PID control such that air at a predetermined temperature is blown out of the cooling units 61 and 62, and calculates the control parameter.

Next, in step S104, the controller 103 controls the rotational speed of the blower 71 and the opening in the cold-water flow control valve 40 on the basis of the control parameter calculated in step S103. At this time, the controller 103 drives the water-sprinkler pump 72 so as to rotate at a predetermined rotational speed.

On the other hand, when it is determined, in step S102, that the outside-air condition parameter Z is greater than the predetermined value $Z_0$, i.e., when no is determined in step S102, the operation of the controller 103 goes to step S105. In step S105, the controller 103 stops the driving of the blower 71. Then, in step S106, the controller 103 stops the driving of the water-sprinkler pump 72.

In step S107, the controller 103 calculates the control parameter in a manner similar to the aforementioned manner. Then, in step S108, the controller 103 controls the opening in the cold-water flow control valve 40 according to the control parameter calculated in step S107.

As explained above, when the outside-air condition parameter Z is greater than the predetermined value $Z_0$, i.e., when no is determined in step S102, the controller 103 stops the driving of the blower 71 and the water-sprinkler pump 72 in the refrigerant cooling tower 70 (in step S105 and S106). At this time, the amount of condensation in the water-cooled condenser 50 becomes greater than the amount of condensation in the refrigerant cooling tower 70. Therefore, the pressure in the secondary heat-transfer tube h2 in the water-cooled condenser 50 becomes lower than the pressure in the heat-transfer tube h5 in the refrigerant cooling tower 70, so that the major portion of the refrigerant gas flows into the water-cooled condenser 50 through the piping arrangement b4, and condenses in the water-cooled condenser 50.

2.3 Advantages of Second Embodiment

In the cooling system 100 according to the second embodiment, when the outside-air condition parameter Z is greater than the predetermined value $Z_0$, i.e., when no is determined in step S102, the controller 103 stops the driving of the blower 71 and the water-sprinkler pump 72, so that the refrigerant gas condenses in the water-cooled condenser 50.

For example, if the blower 71 is driven when the outside-air temperature T is higher than the condensation temperature of the refrigerant gas, the refrigerant gas does not condense in the refrigerant cooling tower 70, returns to the connection point F, and joins at the connection point F the liquid refrigerant condensed in the water-cooled condenser 50, so that heat is transferred from the refrigerant gas to the liquid refrigerant. Therefore, the total cooling efficiency in the cooling system 100 is lowered.

Further, if the blower 71 and the water-sprinkler pump 72 are driven when the outside-air humidity D is high (for example, when the humidity of the outside air is 95%), the amount of evaporation of the sprinkled water is small. Therefore, the total cooling efficiency in the cooling system 100 is also lowered in the above case.

In contrast, according to the second embodiment, the driving of the blower 71 and the water-sprinkler pump 72 is stopped when the value of the outdoor condition parameter Z is greater than the predetermined value $Z_0$. Therefore, the refrigerant gas which flows upward through the piping arrangement b3 flows into the water-cooled condenser 50, undergoes heat exchange with the cold water flowing out of the primary heat-transfer tube h1, and condenses. Thus, the major portion of the refrigerant in the secondary system 102 naturally circulates in the circuit constituted by the piping arrangements b1 to b5 and b8 to b10, and the refrigerant does not circulate on the refrigerant cooling tower 70 side. Therefore, it is possible to prevent the liquid refrigerant flowing out of the water-cooled condenser 50 from absorbing the heat of the refrigerant gas (or the liquid refrigerant having a relatively high temperature) flowing out of the refrigerant cooling tower 70. Consequently, the energy efficiency in the cooling system 100 according to the second embodiment is improved compared with the first embodiment.

3. Third Embodiment

3.1 Outline of Third Embodiment

The third embodiment is similar to the first embodiment except that the water-cooled condenser 50 and the refrigerant cooling tower 70 are connected in series. Therefore, the following explanations are focused on the differences from the first embodiment, and the explanations on the portions of the third embodiment similar to the first embodiment are not presented below.

3.2 Configuration of Third Embodiment

Figure 4:
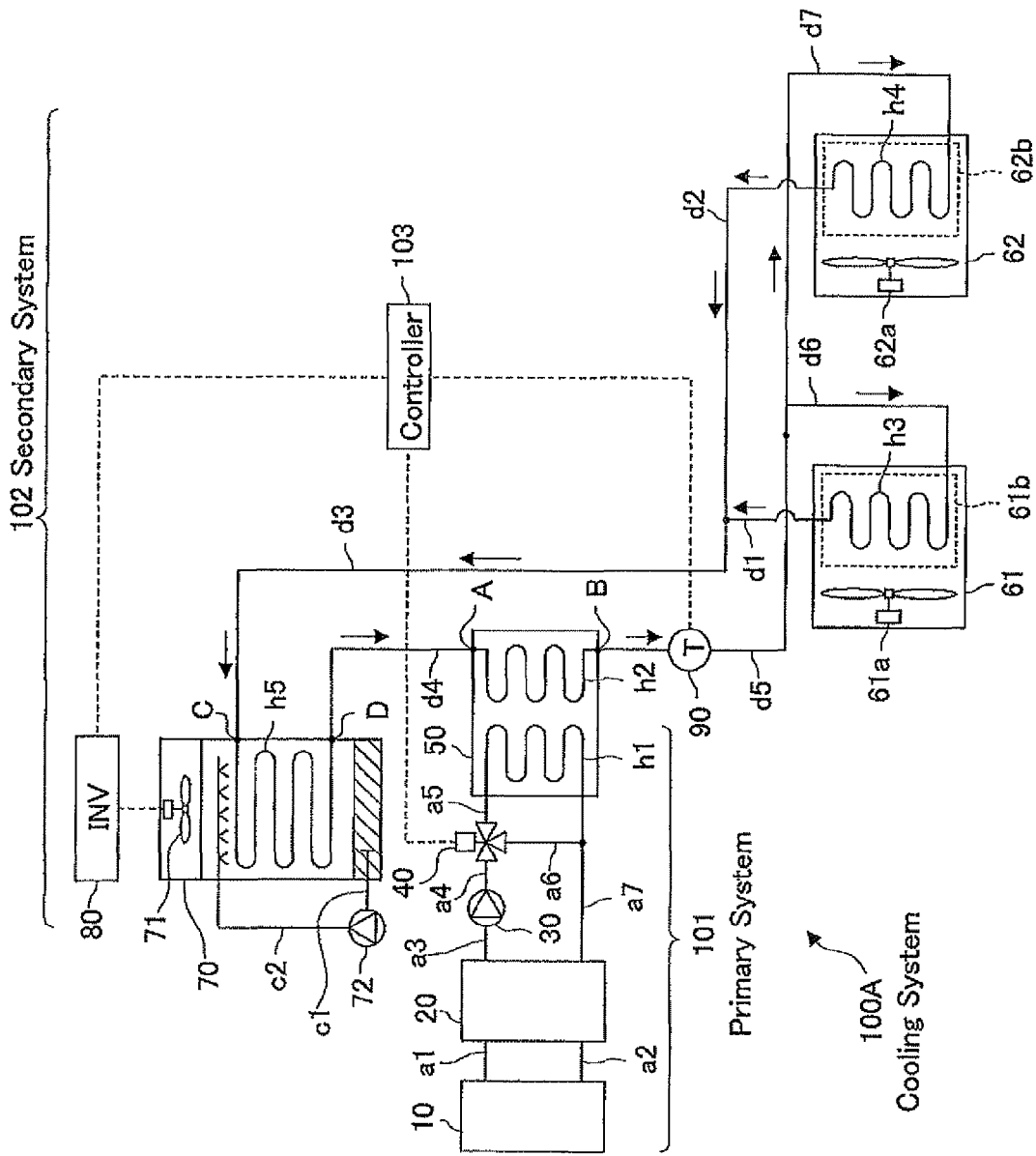
FIG. 4 is a diagram illustrating a cooling system according to a third embodiment of the present invention.

FIG. 4 is a diagram illustrating a configuration of the cooling system 100A according to the third embodiment. In the primary system 101 in the configuration of FIG. 4 is similar to the primary system 101 in FIG. 1. In addition, the constructions of the water-cooled condenser 50, the cooling units 61 and 62, and the refrigerant cooling tower 70 in the configuration of FIG. 4 are similar to FIG. 1. Therefore, explanations on the constructions of the above elements are not repeated, and the following explanations are focused on the connections between the above elements.

As illustrated in FIG. 4, the outlet of the heat-transfer tube h3 in the cooling unit 61 is connected to the inlet C of the heat-transfer tube h5 in the refrigerant cooling tower 70 through piping arrangements d1 and d3, and the outlet of the heat-transfer tube h4 in the cooling unit 62 is also connected to the inlet C of the heat-transfer tube h5 in the refrigerant cooling tower 70 through a piping arrangement d2 and the piping arrangement d3.

The refrigerant cooling tower 70 is arranged at a higher elevation than the cooling units 61 and 62, and the inlet C of the heat-transfer tube h5 is arranged at a higher elevation than the outlet D of the heat-transfer tube h5. Therefore, the liquid refrigerant which is produced by heat exchange with the outside air (and the water) flows downward through the heat-transfer tube h5 by gravity.

The inlet A of the secondary heat-transfer tube h2 in the water-cooled condenser 50 is connected to the outlet D of the heat-transfer tube h5 in the refrigerant cooling tower 70. It is preferable that the water-cooled condenser 50 be arranged at a lower elevation than the refrigerant cooling tower 70 as illustrated in FIG. 3 because the liquid refrigerant flowing out of the heat-transfer tube h5 in the refrigerant cooling tower 70 flows downward through a piping arrangement d4 by gravity in the above configuration.

In addition, the water-cooled condenser 50 is arranged at a higher elevation than the cooling units 61 and 62, and the inlet A of the secondary heat-transfer tube h2 is arranged at a higher elevation than the outlet B of the secondary heat-transfer tube h2. In this configuration, the liquid refrigerant flowing into the inlet A of the secondary heat-transfer tube h2 flows downward through the secondary heat-transfer tube h2 by gravity and then flows out of the outlet B. Thereafter, the liquid refrigerant flows downward through piping arrangements d5 to d7 to the cooling units 61 and 62. Further, the liquid-refrigerant temperature sensor 90 is arranged in the piping arrangement d5.

3.3 Flow of Refrigerant

When high-temperature air in the room (as the space subject to air conditioning) is blown by the fan 61a into the cooling unit 61, the liquid refrigerant flowing through the heat-transfer tube h3 in the evaporator 61b undergoes heat exchange with the high-temperature air (i.e., absorbs heat of the high-temperature air) to evaporate into the refrigerant gas. At this time, the high-temperature air blown by the fan 61a is cooled by transferring heat to the refrigerant, so that cool-temperature air having a predetermined temperature is blown out of the cooling unit 61. On the other hand, the refrigerant gas flown out of the heat-transfer tube h3 flows upward through the piping arrangements d1 and d3. In addition, operations similar to the cooling unit 61 occur in the cooling unit 62, so that the refrigerant gas from the cooling unit 62 flows upward through the piping arrangements d2 and d3.

Further, the refrigerant gas which flows into the heat-transfer tube h5 through the piping arrangement d3 undergoes heat exchange with (transfers heat to) the outside air blown by the blower 71 and the water sprinkled from the underside of the downstream portion of the piping arrangement c2, so that the refrigerant gas condenses into liquid. Then, the liquid refrigerant flows downward through the heat-transfer tube h5 and the piping arrangement d4 by gravity, and flows into the secondary heat-transfer tube h2 in the water-cooled condenser 50.

The liquid refrigerant flows downward through the secondary heat-transfer tube h2 and the piping arrangements d5 to d7 to the cooling units 61 and 62 by gravity. The liquid refrigerant flowing through the secondary heat-transfer tube h2 undergoes heat exchange with (transfers heat to) the cold water flowing through the primary heat-transfer tube h1, so that the liquid refrigerant is further cooled.

Thus, the refrigerant naturally circulates in the secondary system 102.

3.4 Operations of Cooling System

The operations of the cooling system 100A according to the third embodiment are similar to the first embodiment.

That is, the controller 103 sets the control parameter on the basis of the liquid-refrigerant temperature detected by the liquid-refrigerant temperature sensor 90, and preferentially drives the blower 71 and the water-sprinkler pump 72 in the refrigerant cooling tower 70. In addition, the water-cooled condenser 50 makes up for the shortage of refrigeration in the refrigerant cooling tower 70.

3.4 Advantages of Third Embodiment

In the cooling system 100A according to the third embodiment, the refrigerant naturally circulates in the configuration in which the water-cooled condenser 50 and the refrigerant cooling tower 70 are connected in series, and air conditioning (cooling) is performed according to the liquid-refrigerant temperature. Therefore, no pump for pumping the refrigerant is needed, so that the total running cost of the cooling system 100A can be reduced.

Further, in the cooling system 100A, the flow of the cold water used for cooling the refrigerant can be minimized, and the thermal driving power consumed by the heat-source equipment 10 can also be minimized. Therefore, the total running cost of the cooling system 100A can be reduced, and the energy saving performance can be improved.

4. Variations

Although the cooling systems according to the present invention are explained above by using the first to third embodiments, the scope of the present invention is not limited to the explained embodiments, and includes various modifications, for example, as explained below.

4.1 Variation 1

Although the three-way valve is used as the cold-water flow control valve 40 in the explained embodiments, the cold-water flow control valve 40 may be any valve in which the flow rate of the cold water supplied to the water-cooled condenser 50 can be controlled. For example, it is possible to arrange a two-way valve in each of the piping arrangements a5 and a6, and control the flow rate of the cold water by adjusting the opening of each two-way valve.

4.2 Variation 2

Although the refrigerant cooling tower 70 includes the water-sprinkler pump 72 in the explained embodiments, the water-sprinkler pump 72 (and the piping arrangements c1 and c2) may be dispensed with in the case where the refrigerant cooling tower 70 without the water-sprinkler pump 72 has a sufficient refrigeration capacity. In this case, when the outside-air temperature detected by the outside-air temperature sensor is higher than a predetermined temperature (e.g., the condensation temperature of the refrigerant which is preset when the cooling system 100 or 100A is designed), the controller 103 stops the driving of the blower 71, and supplies the cold water to the water-cooled condenser 50 through the cold-water flow control valve 40.

If the blower 71 is driven when the outside-air temperature is higher than the condensation temperature of the refrigerant, the following situation occurs. That is, the liquid refrigerant flowing out of the water-cooled condenser 50 joins the refrigerant gas (or the liquid refrigerant having a relatively high temperature) flowing out of the blower 71, and absorbs heat of the refrigerant gas (or the liquid refrigerant having the relatively high temperature). Therefore, the energy efficiency in the cooling system 100 or 100A is lowered.

In contrast, the driving of the blower 71 is stopped when the outside-air temperature is higher than the condensation temperature of the refrigerant in the above variation 2. Therefore, it is possible to prevent the refrigerant from exchanging the heat with the high-temperature outside air, and improve the energy efficiency in the cooling system 100 or 100A. In addition, the installation cost can be reduced by the absence of the water-sprinkler pump 72.

4.3 Variation 3

It is possible to combine all or part of the features of different ones of the above embodiments as needed. For example, the feature of the second embodiment may be applied to the cooling system 100A according to the third embodiment. That is, in the third embodiment, the driving of the blower 71 and the water-sprinkler pump 72 may be stopped when the outside-air condition parameter Z is greater than the predetermined value $Z_0$. Even in this case, unnecessary heat exchange between the refrigerant and the outside air is suppressed, so that the energy-saving performance can be improved.

4.4 Variation 4

Although the two cooling units are arranged in parallel in the explained embodiments, the number of cooling units need not be limited to two. For example, one or three cooling units may be arranged in parallel.

4.5 Variation 5

Although, in the explained embodiments, the rotational speed of the blower 71 is changed when the control parameter is equal to or greater than X0 and smaller than X1 and the opening in the cold-water flow control valve 40 is changed when the control parameter is equal to or greater than X1 and smaller than X2, the rotational speed of the blower 71 and the opening in the cold-water flow control valve 40 may be controlled in other manners. For example, the controller 103 may concurrently change the rotational speed of the blower 71 and the opening in the cold-water flow control valve 40.

4.6 Variation 6

Although each of the water-cooled condenser 50 and the refrigerant cooling tower 70 is singly arranged in the cooling systems 100 and 100A in the explained embodiments, either of the water-cooled condenser 50 and the refrigerant cooling tower 70 may be multiply arranged. For example, multiple water-cooled condensers and multiple refrigerant cooling towers may be arranged in parallel. In this case, it is preferable that the cold-water pump 30 be commonly (singly) arranged and the flow rate of the cold water supplied to each water-cooled condenser be controlled according to the opening of the corresponding cold-water flow control valve.

What is claimed is:

1. A cooling system comprising:
   an evaporator which evaporates a refrigerant by heat exchange with room air subject to air conditioning;
   a water-cooled condenser which is arranged at an elevation higher than an elevation at which the evaporator is arranged, and condenses the refrigerant by heat exchange with cold water when the refrigerant flows into the water-cooled condenser from the evaporator through a portion of a piping arrangement;

a cold-water flow control valve which controls a flow rate of the cold water supplied to the water-cooled condenser;

a refrigerant cooling tower which is arranged at a higher elevation than the elevation at which the evaporator is arranged, connected in series or in parallel with the water-cooled condenser, and condenses the refrigerant by heat exchange with outside air when the refrigerant flows into the refrigerant cooling tower from the evaporator through another portion of the piping arrangement;

a blower which is arranged at the refrigerant cooling tower and blows the outside air;

a refrigerant-temperature detection means which detects temperature of the refrigerant when the refrigerant returns to the evaporator through a further portion of the piping arrangement after being condensed by at least one of the water-cooled condenser and the refrigerant cooling tower; and a control means which changes at least one of an opening in the cold-water flow control valve and a rotational speed of a motor in the blower, according to the temperature of the refrigerant detected by the refrigerant-temperature detection means;

wherein the control means calculates a control parameter corresponding to cooling performance of the cooling system such that the temperature of the refrigerant detected by the refrigerant-temperature detection means approaches a target refrigerant temperature corresponding to an air-conditioning temperature which is set for the air conditioning, drives the blower while stopping supply of the cold water to the water-cooled condenser in a first case where the control parameter is smaller than a predetermined value, and controls the opening of the cold-water flow control valve so as to supply the cold water to the water-cooled condenser while driving the blower in a second case where the control parameter is equal to or greater than the predetermined value.

2. The cooling system according to claim 1, further comprising an outside-air temperature detection means which detects temperature of the outside air, wherein the control means stops driving of the blower and controls the cold-water flow control valve so as to supply the cold water to the water-cooled condenser when the temperature of the outside air detected by the outside-air temperature detection means is higher than a predetermined temperature.

3. The cooling system according to claim 2, further comprising an outside-air humidity detection means which detects humidity of the outside air, and a water-sprinkler pump which sprinkles water on a piping arrangement through which the refrigerant flows in the refrigerant cooling tower, and is driven and stopped in synchronization with the blower, wherein when an outside-air condition parameter determined on the basis of the temperature of the outside air detected by the outside-air temperature detection means and the humidity of the outside air detected by the outside-air humidity detection means is greater than a predetermined outside-air value, the control means stops driving of the blower and the water-sprinkler pump, and controls the cold-water flow control valve so as to supply the cold water to the water-cooled condenser.

4. A cooling method performed in a cooling system including, an evaporator which evaporates a refrigerant by heat exchange with room air subject to air conditioning, a water-cooled condenser which is arranged at an elevation higher than an elevation at which the evaporator is arranged, and condenses the refrigerant by heat exchange with cold water when the refrigerant flows into the water-cooled condenser from the evaporator through a portion of a piping arrangement, a cold-water flow control valve which controls a flow rate of the cold water supplied to the water-cooled condenser, a refrigerant cooling tower which is arranged at a higher elevation than the elevation at which the evaporator is arranged, connected in series or in parallel with the water-cooled condenser, and condenses the refrigerant by heat exchange with outside air when the refrigerant flows into the refrigerant cooling tower from the evaporator through another portion of the piping arrangement, a blower which is arranged at the refrigerant cooling tower and blows the outside air, a refrigerant-temperature detection means which detects temperature of the refrigerant when the refrigerant returns to the evaporator through a further portion of the piping arrangement after being condensed by at least one of the water-cooled condenser and the refrigerant cooling tower, and a control means;

the cooling method comprising:

detecting the temperature of the refrigerant by the refrigerant-temperature detection means; and changing, by the control means, at least one of an opening in the cold-water flow control valve and a rotational speed of a motor in the blower according to the temperature of the refrigerant detected by the refrigerant-temperature detection means;

calculating, via the control means, a control parameter corresponding to cooling performance of the cooling system such that the temperature of the refrigerant detected by the refrigerant-temperature detection means approaches a target refrigerant temperature corresponding to an air-conditioning temperature which is set for the air conditioning;

driving, via the control means, the blower while stopping supply of the cold water to the water-cooled condenser in a first case where the control parameter is smaller than a predetermined value; and controlling, via the control means, the opening of the cold-water flow control valve so as to supply the cold water to the water-cooled condenser while driving the blower in a second case where the control parameter is equal to or greater than the predetermined value.

\* \* \* \* \*